United States Patent
Nakazawa (10) Patent No.: US 6,938,649 B2
(45) Date of Patent: Sep. 6, 2005

(54) SUBSTRATE HOLDING DEVICE, SUBSTRATE PROCESSING APPARATUS, AND METHOD OF RELEASING SUBSTRATE

(75) Inventor: Yoshiyuki Nakazawa, Kyoto (JP)

(73) Assignee: Dainippon Screen Mfg. Co., Ltd, Kyoto (JP)

( * ) Notice: Subject to any disclaimer, the term of this patent is extended or adjusted under 35 U.S.C. 154(b) by 20 days.

(21) Appl. No.: 10/649,736

(22) Filed: Aug. 28, 2003

(65) Prior Publication Data

US 2004/0047718 A1 Mar. 11, 2004

(30) Foreign Application Priority Data

Sep. 11, 2002 (JP) ..................... P2002-265323

(51) Int. Cl.$^7$ .............................. B65B 31/00
(52) U.S. Cl. ................. 141/7; 141/8; 141/44; 141/52; 141/63; 141/98
(58) Field of Search ............ 141/4, 8, 11, 44, 141/48, 52, 59, 63, 69, 83, 85, 89, 94, 98; 118/50, 56, 715; 396/611

(56) References Cited

U.S. PATENT DOCUMENTS

| | | | | |
|---|---|---|---|---|
| 5,616,208 A | * | 4/1997 | Lee | 156/345.24 |
| 6,012,509 A | * | 1/2000 | Nonaka | 165/80.2 |
| 6,054,751 A | | 4/2000 | Ichikawa et al. | |
| 6,585,430 B2 | * | 7/2003 | Matsuyama et al. | 396/611 |
| 6,591,406 B2 | | 7/2003 | Ishikawa | |
| 6,657,318 B2 | | 12/2003 | Ishikawa et al. | |
| 2002/0109205 A1 | | 8/2002 | Sawada et al. | |

FOREIGN PATENT DOCUMENTS

| | | |
|---|---|---|
| JP | 07-263324 | 10/1995 |
| JP | 2002-229216 A | 8/2002 |

* cited by examiner

Primary Examiner—Timothy L. Maust
(74) Attorney, Agent, or Firm—McDermott Will & Emery LLP (57) ABSTRACT

A substrate holding part in a substrate processing apparatus includes a fixing table having a suction pipe and a supply pipe, and a holding member having atmosphere flow passages for vacuum-holding a substrate. The holding member is placed on the fixing table. The suction pipe is connected through a pipe to a compressor, and the supply pipe is connected through a pipe and a solenoid valve to a gas supply part. When the substrate holding part holds a substrate, the compressor sucks an atmosphere through the suction pipe to cause the holding member to vacuum-hold the substrate. When the substrate holding part releases the substrate, a gas is supplied from the gas supply part through the supply pipe by opening the solenoid valve while the suction through the suction pipe continues. The substrate holding device and the substrate processing apparatus suppress the deposition of particles on the substrate.

13 Claims, 5 Drawing Sheets

SUBSTRATE HOLDING DEVICE, SUBSTRATE PROCESSING APPARATUS, AND METHOD OF RELEASING SUBSTRATE

BACKGROUND OF THE INVENTION

1. Field of the Invention

The present invention relates to a substrate processing apparatus for performing a predetermined process in a substrate manufacturing operation and the like. More particularly, the invention relates to a technique for holding and releasing a substrate in such a substrate processing apparatus.

2. Description of the Background Art

A substrate processing apparatus for performing a predetermined process on a substrate (or a wafer), such as a coater for applying a processing solution onto a substrate and various inspection apparatuses for inspecting processing in a manufacturing operation for propriety, involves the need to fix the substrate in a predetermined position or to hold the substrate so as to securely transport the substrate. Conventionally, there has been proposed a substrate holding device for holding a substrate on a plate by means of a wafer suction mechanism for vacuum-holding the substrate in such cases. Such a substrate holding device is configured to cause the wafer suction mechanism to stop the atmosphere suction to thereby release the substrate when transporting the substrate from the plate which holds the substrate.

Unfortunately, the conventional substrate holding device presents a problem in that at the instant when the atmosphere suction is stopped, a backflow of atmosphere from the wafer suction mechanism takes place to blow particles in a pipe together with air against the substrate. Deposition of the particles on the substrate due to the backflow becomes a cause of reduction in yields of products.

SUMMARY OF THE INVENTION

The present invention is intended for an apparatus for performing a predetermined process in a substrate manufacturing operation and the like. More particularly, the invention is intended for a technique for holding a substrate in such an apparatus.

According to the present invention, a substrate holding device for holding a substrate comprises: a holding member having an atmosphere flow passage for holding the substrate; a suction pipe for sucking an atmosphere through the atmosphere flow passage; and a supply pipe for supplying a predetermined gas through the atmosphere flow passage, wherein the predetermined gas is supplied through the supply pipe while the atmosphere is sucked through the suction pipe, to release the substrate from the holding member. This prevents the substrate from being contaminated by a backflow of particles in the suction pipe.

Preferably, the supply rate of the predetermined gas supplied through the supply pipe for releasing the substrate is not less than the suction rate of the atmosphere sucked through the suction pipe, whereby the substrate is easily separated from the holding member.

Preferably, the substrate holding device further comprises a fixing table for fixing the holding member, wherein the holding member is removably placed on the fixing table. Therefore, the maintenance of the holding member is facilitated.

Preferably, the fixing table includes a positioning member for determining the relative position of the holding member and the fixing table, whereby the holding member is easily mounted in a predetermined position of the fixing table.

Preferably, the predetermined gas is an inert gas. The supply of the gas having a stable property to the substrate prevents damages resulting from alteration of the material of the substrate.

Preferably, the supply pipe includes an adjustment mechanism for adjusting the supply rate of the predetermined gas, whereby a suitable amount of gas is easily supplied.

Preferably, the substrate holding device further comprises a guide member for guiding the substrate. This prevents the substrate from dropping when the substrate is released.

According to the present invention, a substrate processing apparatus for performing a predetermined process on a substrate comprises: a) a substrate holding device including a-1) a holding member having an atmosphere flow passage for holding the substrate, a-2) a suction pipe for sucking an atmosphere through the atmosphere flow passage, and a-3) a supply pipe for supplying a predetermined gas through the atmosphere flow passage, the predetermined gas being supplied through the supply pipe while the atmosphere is sucked through the suction pipe, to release the substrate from the holding member; and b) a processing unit for performing the predetermined process on the substrate held by the substrate holding device. This prevents the substrate from being contaminated during the predetermined process.

The present invention is also intended for a method of releasing a substrate in a substrate holding device having an atmosphere flow passage for holding a substrate under suction, comprising the steps of (a) sucking an atmosphere through a suction pipe as a part of the atmosphere flow passage; (b) holding a substrate; (c) supplying a predetermined gas through a supply pipe as a part of the atmosphere flow passage; and (d) in a state in which the step (a) continues, releasing the substrate held in the step (b), the step (d) being triggered by the step (c). This prevents the substrate from being contaminated by a backflow of particles in the suction pipe.

It is therefore an object of the present invention to provide a substrate holding device and a substrate processing apparatus capable of suppressing the deposition of particles on a substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
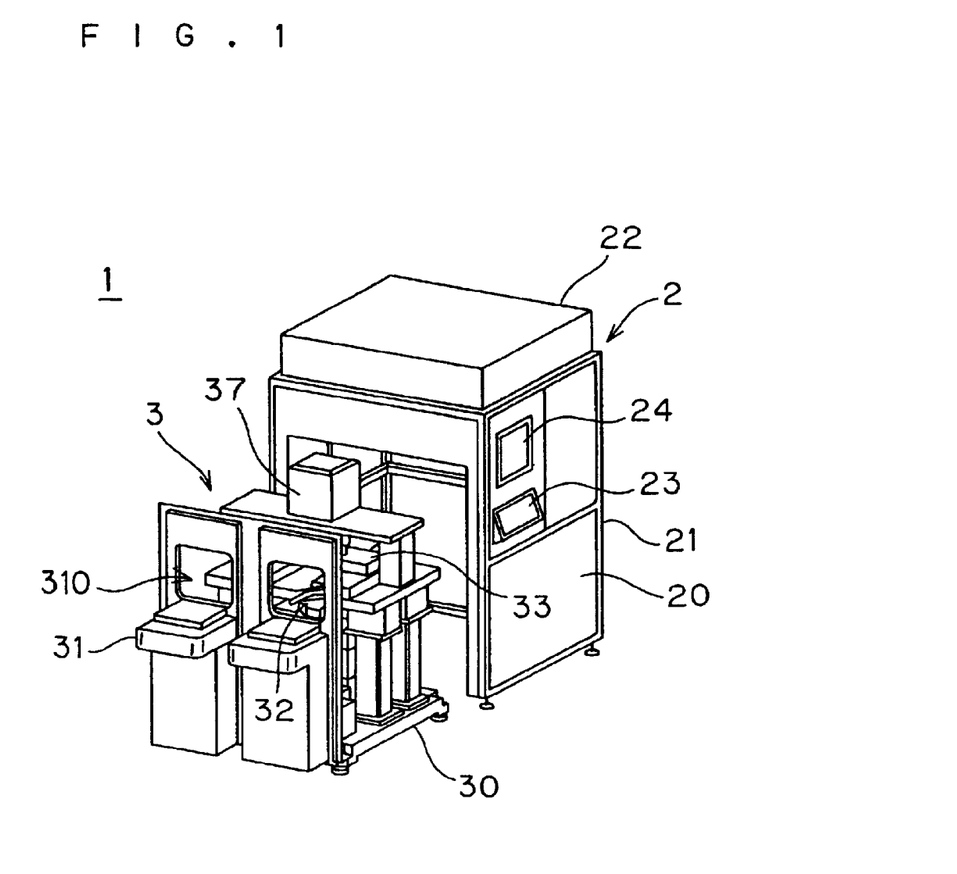
FIG. 1 is a view of an inspection apparatus with a main body part pulled out of a cabinet part according to a preferred embodiment of the present invention.

FIG. 1 is a view of an inspection apparatus 1 with a main body part 3 pulled out of a cabinet part 2 according to a preferred embodiment of the present invention. The inspection apparatus 1 is, for example, an apparatus for measuring results of various processing steps performed on a substrate in a manufacturing operation to inspect the substrate based on the measurement results. Since the inspection performed by the inspection apparatus 1 is a "predetermined process" on a substrate, the inspection apparatus 1 corresponds to a substrate processing apparatus according to the present invention.

In the inspection apparatus 1, the cabinet part 2 of a substantially box-like configuration with an open bottom is disposed to surround the upper and side portions of the main body part 3, with the cabinet part 2 and the main body part 3 separated from each other.

The cabinet part 2 includes: a cover 20; a frame 21 for attaching the cover 20 thereto; an FFU (Fan Filter Unit) 22 for supplying and sending air as an atmosphere from the cabinet part 2 toward the main body part 3; a manipulation part 23 for operator's manual operation of the inspection apparatus 1; and a display part 24 for displaying various data such as inspection results.

The cover 20 is a box-like member with an open top and an open bottom and having a relatively large opening on one side surface thereof. The cover 20 is provided to mainly cover a peripheral portion of the main body part 3. The cover 20 need not consist of a single member, but may include a plurality of plate-like members on respective side surfaces thereof and attached to predetermined positions of the frame 21, thereby to cover the main body part 3.

The FFU 22 is disposed above the main body part 3, and is attached to the frame 21 so as to define the upper surface of the cabinet part 2. Thus, the FFU 22 supplies air from above toward the main body part 3.

The main body part 3 includes: a base 30 with a substrate holding part 33 and a measurement part 37 mounted thereon; a cassette mounting part 31 for placing thereon a cassette for receiving a substrate 90 (See FIG. 2); a transport part 32 for transporting the substrate 90 to and from the substrate holding part 33; the substrate holding part 33 for holding the substrate 90 in a predetermined position; and the measurement part 37 for making a predetermined measurement on the substrate 90 held by the substrate holding part 33.

Not only are the substrate holding part 33 and the measurement part 37 mounted on the base 30, but the cassette mounting part 31 and the transport part 32 are also fixed to the base 30. The outside perimeter of the bottom surface of the base 30 is shorter than the inside perimeter of the cabinet part 2, and the base 30 is disposed in unfixed relation with the cabinet part 2. In other words, the cabinet part 2 and the main body part 3 are separable from each other in the inspection apparatus 1. Thus, if the positions of the manipulation part 23 and the display part 24 are desired to change, for example, in accordance with the layout of a cleanroom, such a desire is easily met by replacing the cabinet part 2 being used with another cabinet part 2 having the parts 23 and 24 disposed in desired positions.

Iron castings of sufficient strength and the like are used for the base 30 so as to prevent distortions, if any, of a floor plate due to the weight of the inspection apparatus 1 from affecting the relative positions of the measurement part 37 and the substrate holding part 33. This enables the inspection apparatus 1 to maintain sufficient inspection accuracy, thereby to eliminate the need to use reinforcements for the inspection of the substrate 90.

The cassette mounting part 31 is provided on the front face of the main body part 3 in fixed relation with the base 30. A cassette in which the substrate 90 to be inspected (or an inspected substrate) is held is placed on the cassette mounting part 31, as described above. The cassette mounting part 31 has a pair of openings 310 through which the transport part 32 gains access to the substrate 90 held in the cassette. The cassette mounting part 31 of the inspection apparatus 1 is capable of mounting two cassettes thereon, one of the cassettes being used for a substrate loading purpose and the other for a substrate unloading purpose.

The transport part 32 is movable leftwardly and rightwardly (horizontally), and also includes a lifting mechanism for vertical movement. The transport part 32 further includes an arm which moves while holding the substrate 90 to transport the substrate 90 between the cassette and the substrate holding part 33.

Figure 2:
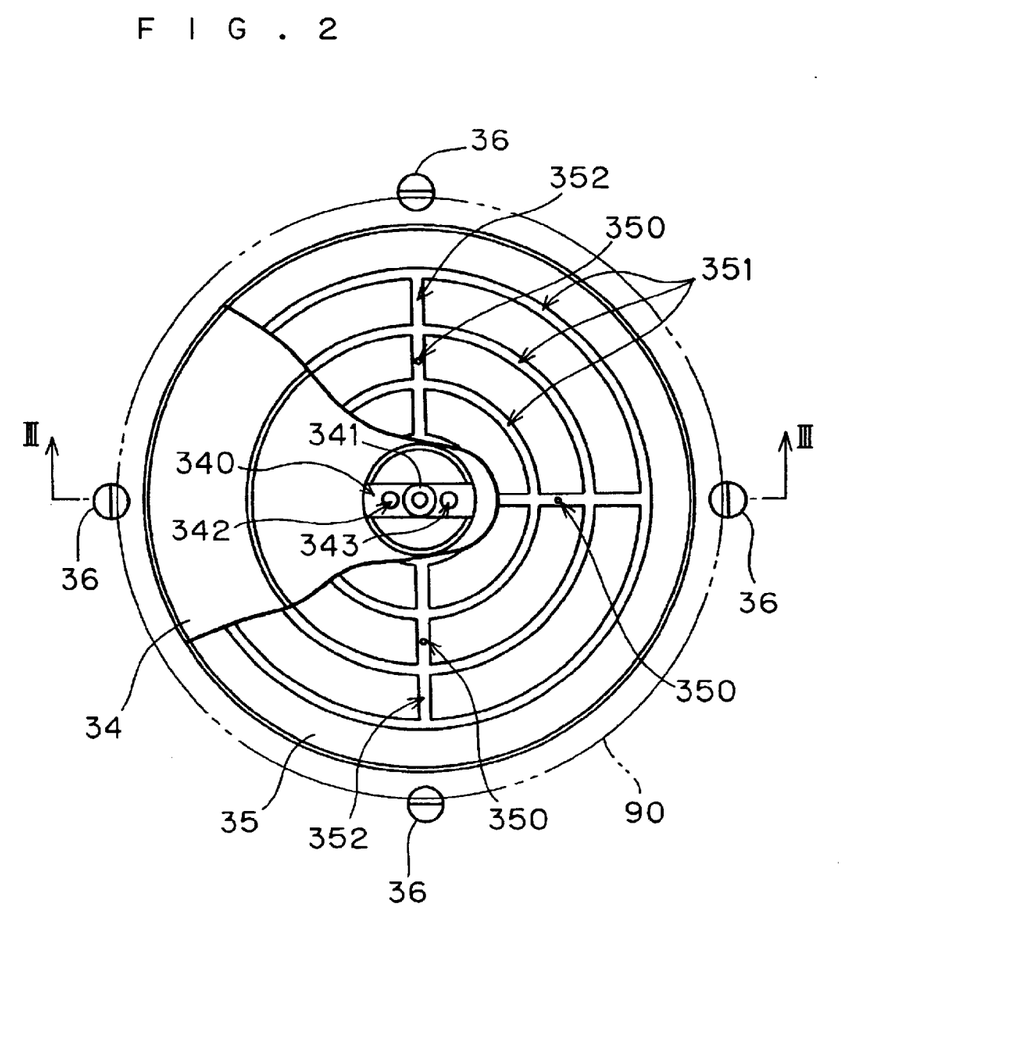
FIG. 2 is a plan view showing a principal construction of a substrate holding part.
Figure 3:
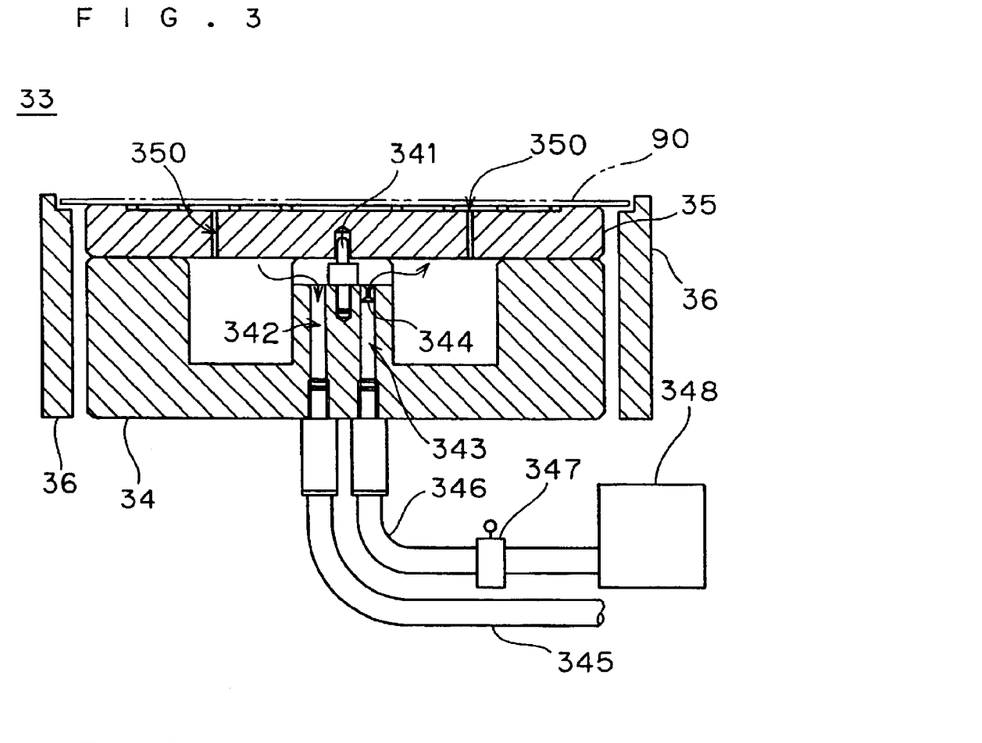
FIG. 3 is a sectional view of the substrate holding part taken along the line III—III of FIG. 2.
Figure 4:
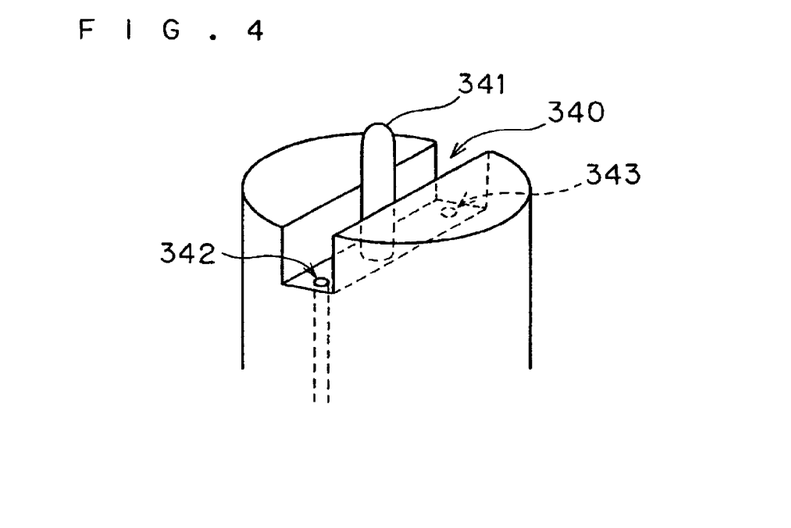
FIG. 4 is an enlarged view of a fixing pin of a fixing table and its surroundings.

FIG. 2 is a plan view of the substrate holding part 33. FIG. 3 is a sectional view of the substrate holding part 33 taken along the line III—III of FIG. 2. FIG. 4 is an enlarged view of a fixing pin 341 of a fixing table 34 and its surroundings. A holding member 35 is shown in FIG. 2 as partially cut away (along a heavy line) to show the interior thereof. Although a disc-shaped substrate is taken as an example of the substrate 90 to be inspected in this preferred embodiment as shown in FIG. 2, the configuration of the substrate 90 is not limited to this. For example, a rectangular substrate 90 for a display may be used. The substrate 90 may be made of a material capable of being vacuum-held. Examples of the material of the substrate 90 include semiconductor, metal, and glass.

The fixing table 34 has a cylindrical protrusion shown in FIG. 4 provided in the center thereof. The fixing table 34 includes: a groove 340 provided in the protrusion; the fixing pin 341 provided in a predetermined position in the groove 340 (in the center of the fixing table 34); and a suction pipe 342 and a supply pipe 343 provided in the bottom surface of the groove 340. The holding member 35 is removably mounted on the upper surface of the fixing table 34.

The fixing pin 341 is inserted in a hole provided in the central position of the bottom surface of the holding member 35, as shown in FIG. 3, to function as a positioning member for determining the horizontal relative positions of the body of the fixing table 34 and the holding member 35. This allows the holding member 35 to be easily mounted to the fixing table 34 with high accuracy in the inspection apparatus 1.

The suction pipe 342 is a cylindrical hole formed through the fixing table 34 in this preferred embodiment, and is connected to a pipe 345 mounted to the bottom surface of the fixing table 34. The pipe 345 is connected to a compressor or the like not shown. The compressor is driven to suck an atmosphere out of the apparatus.

The supply pipe 343 has an orifice 344 provided near a supply port in the surface of the fixing table 34 for adjusting the amount of supply. The supply pipe 343 is similar to the suction pipe 342 in being structured as a cylindrical hole formed through the fixing table 34, and is connected to a pipe 346 mounted to the bottom surface of the fixing table 34. The pipe 346 is connected through a solenoid valve 347 to a gas supply part 348 for directing a gas supplied from the gas supply part 348 toward the orifice 344.

The orifice 344 is provided with a hole having a predetermined diameter to have the function of holding the amount of gas passing therethrough substantially constant, and is an easily replaceable member.

The gas supply part 348 supplies the gas through the pipe 346 to the supply pipe 343 by opening and closing the solenoid valve 347. The predetermined gas supplied from the gas supply part 348 includes, but is not limited to, nitrogen ($N_2$) in this preferred embodiment. For example, other inert gases and mixtures thereof may be used as the predetermined gas. Thus, the substrate holding part 33 uses the inert gas having a stable property as the gas supplied to the substrate 90 to prevent damages resulting from alteration of the material of the substrate 90.

The suction pipe 342 and the supply pipe 343 in the inspection apparatus 1 have the cylindrical tunnel structure provided in the fixing table 34 which in itself functions as a pipe, but are not limited to such a structure. For example, a tubular member may be attached to or formed through the fixing table 34. That is, any known structure capable of directing the gas in a predetermined direction may be used. The gas supplied from the gas supply part 348 is cleaned by removing particles of dust and the like through a filter provided in the pipe 346.

The holding member 35 has flow passages 350 for directing the atmosphere therethrough when holding or releasing the substrate 90, and has the function of holding the substrate 90 by vacuum suction. The holding member 35 is removably placed in a predetermined position of the fixing table 34, with the fixing pin 341 of the fixing table 34 inserted in the hole provided in the center of the bottom surface of the holding member 35. In this state, the holding member 35 is placed under its own weight on the fixing table 34 without any fastening element such as a screw. This allows easy demounting of the holding member 35, for example, when cleaning the holding member 35, to facilitate maintenance of the holding member 35 in the inspection apparatus 1.

As illustrated in FIG. 2, the holding member 35 is formed with a plurality of ring-shaped grooves 351 concentric about the center of the holding member 35, and linear grooves 352 intersecting the grooves 351. Preferably, surfaces (referred to hereinafter as "holding surfaces") of the holding member 35 which are to contact the substrate 90 are prepared as flat as possible and in the same plane.

Space defined by the grooves 351 and 352 is substantially sealed against outside while the holding member 35 holds the substrate 90, and the flow passages 350 has respective openings in the bottom surfaces of the grooves 351 and 352.

In the substrate holding part 33, as the atmosphere is sucked through the suction pipe 342 of the fixing table 34, the atmosphere is accordingly sucked also through the flow passages 350. Thus, the atmospheric pressure within the space defined by the grooves 351 and 352 is reduced, whereby the substrate 90 is vacuum-held by the holding surfaces of the holding member 35.

Additionally, the substrate holding part 33 is advantageous in that the above-mentioned structure of the grooves 351 and 352 of the holding member 35 enables the holding surfaces to attach substantially uniformly to the bottom surface of the substrate 90 when holding member 35 vacuum-holds the substrate 90. It is hence possible to suppress deformation of the substrate 90 due to nonuniform forces exerted on the substrate 90. For uniform attachment of the substrate 90, a relatively large number of flow passages 350 may be provided uniformly in the holding surfaces of the holding member 35.

A plurality of substrate guides 36 are disposed substantially along the outer periphery of the substrate 90 when the substrate 90 is held by the holding member 35, and in particular has the function of preventing the substrate 90 from moving in a direction parallel to the holding surfaces.

Thus, the substrate holding part 33 can prevent the substrate 90 from dropping when the substrate 90 is released. Although the inspection apparatus 1 according to the preferred embodiment has the four substrate guides 36, the number of substrate guides 36 is not limited to four, but may be at least three. Unless the substrate guides 36 are of the type substantially having point contact with the substrate 90 (e.g., when the substrate guides 36 include members in the form of segments of a ring which are disposed along the outer periphery of the substrate 90), the number of substrate guides 36 may be two or less. The substrate guides 36 may be either fixedly provided or driven to guide the substrate 90 only when the substrate 90 is released while being in a retracted position when the substrate 90 is vacuum-held by the holding member 35.

The measurement part 37 functions as a processing unit for performing a predetermined inspection on the substrate 90. The predetermined inspection principally refers to an inspection for the states of various processing performed on the substrate 90 in the manufacturing operation, as described above. Specifically, the predetermined inspection includes a film thickness inspection for measuring the thickness of a resist and the like formed on the substrate 90, and a length measuring inspection for measuring the length of circuitry and the like formed on the substrate 90.

Figure 5:
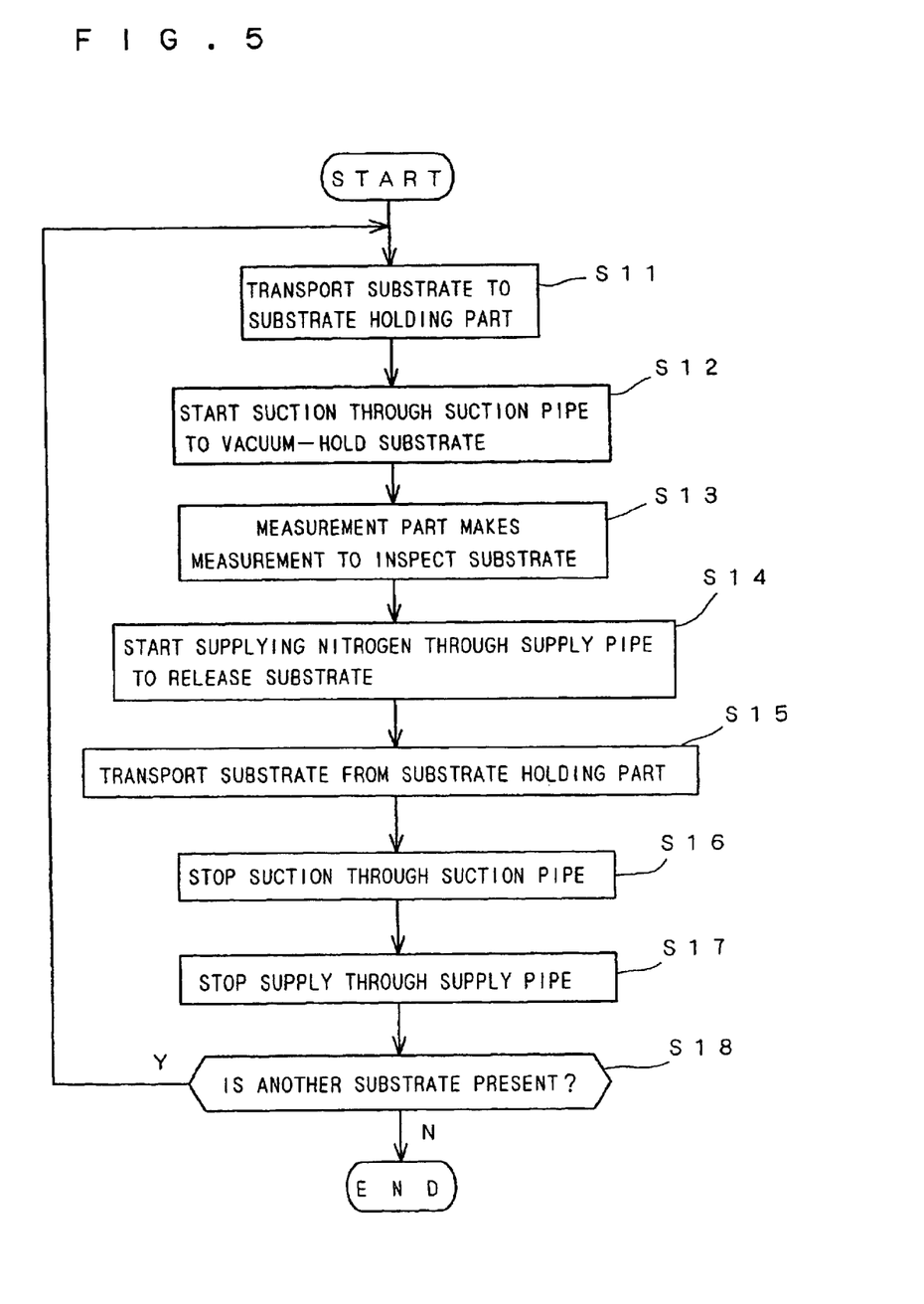
FIG. 5 is a flowchart showing the operation of the inspection apparatus.

The construction of the inspection apparatus 1 is described above. Next, the operation of the inspection apparatus 1 will be described. FIG. 5 is a flowchart showing the operation of the inspection apparatus 1.

First, a cassette containing at least one substrate 90 to be inspected is placed on the cassette mounting part 31 by a transport device not shown or by an operator. Then, the operator manually operates the manipulation part 23 to instruct the inspection apparatus 1 to start the inspection.

In response to the instruction to start the inspection, the transport part 32 of the inspection apparatus 1 takes one substrate 90 out of the cassette to transport the substrate 90 to the substrate holding part 33 (in Step S11). In this step, the transport part 32 sets the substrate 90 in a predetermined position of the holding member 35.

Next, the substrate holding part 33 of the inspection apparatus 1 drives the compressor to start the atmosphere suction through the suction pipe 342. Thus, the substrate 90 is held under suction (or vacuum-held) by the holding member 35 (in Step S12).

After the substrate 90 is vacuum-held, the measurement part 37 makes a predetermined measurement on the substrate 90 to inspect the substrate 90 (in Step S13). The results of measurement and inspection are displayed as appropriate on a screen of the display part 24 so that the operator can recognize the results.

After the measurement by the measurement part 37, the substrate holding part 33 opens the solenoid valve 347. This commences the supply of nitrogen gas from the gas supply part 348 through the supply pipe 343, whereby the substrate 90 is released from the holding member 35 (in Step S14).

The supply rate which is the volume V0 per unit time of nitrogen gas from the gas supply part 348 through the supply pipe 343 is adjusted to satisfy $V0 \geq V1$ where V1 is the suction rate which is the volume per unit time of the atmosphere sucked through the suction pipe 342. Thus, part of the atmosphere present in the space between the fixing table 34 and the holding member 35 passes through the flow passages 350 into the space defined by the grooves 351 and 352 of the holding member 35. As a result, the gas pressure in the space defined by the grooves 351 and 352 becomes equal to or greater than atmospheric pressure to exert a force on the substrate 90 in a direction away from the holding member 35.

Thus, the substrate holding part 33 can easily separate the substrate 90 from the holding member 35 when the substrate 90 is released from the vacuum-held condition. The suction rate or the volume V1 per unit time of the atmosphere sucked through the suction pipe 342 is previously determined and set at a value sufficient for the holding member 35 to vacuum-hold the substrate 90, based on the size and weight of the substrate 90.

The substrate holding part 33 adjusts the supply rate V0 by previously selecting the orifice 344 having a flow rate satisfying the above-mentioned condition (V0≧V1) and then providing the orifice 344 in the supply pipe 343. A mechanism for adjusting the supply amount may be accomplished, for example, by controlling the degree of opening or closing of the solenoid valve 347. In this case, however, since the adjustment is made in a position relatively distant from the supply port, it is not so easy to adjust the supply rate with stability. It is, of course, possible to provide the solenoid valve 347 near the supply port. This, however, necessitates the control of the solenoid valve 347 from a controller or the like for each adjustment.

The substrate holding part 33 of the inspection apparatus 1 includes the orifice 344 near the supply port of the supply pipe 343 as described above. Therefore, once the suitable orifice 344 is selected, the substrate holding part 33 can adjust the supply rate V0 easily and with stability without the need to control from the controller or the like for each adjustment.

The interior of the suction pipe 342 is contaminated because particles deposited on the bottom surface of the substrate 90 and the like is sucked together with the atmosphere during the suction process. However, the substrate holding part 33 sucks the atmosphere through the suction pipe 342 also at the start of the supply of the nitrogen gas through the supply pipe 343. This avoids the backflow of the atmosphere through the suction pipe 342 which has occurred in the conventional apparatus when the substrate 90 is released, thereby to prevent the interior of the suction pipe 342 from being contaminated by the backflow of the particles. Additionally, the prevention of the backflow through the suction pipe 342 also prevents the backflow of oil and dust from devices themselves such as the compressor and a vacuum pump.

To prevent the particles sucked during the suction process from flowing backwardly toward the substrate when releasing the substrate, it is preferable in a substrate holding device to provide an atmosphere flow passage during the suction process and an atmosphere flow passage during the supply process (when releasing the substrate) as completely separate systems. However, the substrate holding part 33 of this preferred embodiment is constructed such that the suction pipe 342 and the supply pipe 343 are open to the space between the fixing table 34 and the holding member 35, and part of the atmosphere flow passage, such as the flow passages 350, is common to the suction process and the supply process. Even in such a structure, little particles remain in the common part so far as the common part has a simple structure. Therefore, the substrate holding part 33 of the inspection apparatus 1 produces the above-mentioned effect.

After the substrate 90 is released, the transport part 32 transports the substrate 90 from the substrate holding part 33 (in Step S15). At this time, the substrate holding part 33 stops the suction through the suction pipe 342 (in Step S16), and stops the supply through the supply pipe 343 (in Step S17). For relatively rough particle management, the sequence of Steps S16 and S17 may be reversed.

The transport part 32 transports the substrate 90 carried from the substrate holding part 33 further into a predetermined position of a cassette placed on the cassette mounting part 31.

When the two cassettes placed on the cassette mounting part 31 are used without distinction between a cassette for the substrate loading purpose and a cassette for the substrate unloading purpose, the substrate 90 having been inspected may be put back into the original cassette. Alternatively, only a substrate 90 judged to be non-defective as a result of inspection may be put back into the original cassette whereas a substrate 90 judged to be defective is put into a different cassette. In this case, inspected substrates 90 are sorted depending on the result of inspection.

After the transport part 32 finishes putting the substrate 90 into the cassette for the substrate unloading purpose, the inspection apparatus 1 judges whether or not a substrate 90 to be inspected is present in the cassette for the substrate loading purpose (in Step S18). If a substrate 90 to be inspected is present in the cassette for the substrate loading purpose, the inspection apparatus 1 repeats the processing from Step S11. The inspection is terminated when the inspection of all of the substrates 90 stored in the cassette for the substrate loading purpose is completed.

As discussed above, the substrate holding part 33 of the inspection apparatus 1 supplies the predetermined gas (nitrogen gas) through the supply pipe 343 while sucking the atmosphere through the suction pipe 342 to release the substrate 90 held by the holding member 35, thereby preventing the substrate 90 from being contaminated by the backflow of particles in the suction pipe 342.

The inspection apparatus 1 for performing the predetermined inspection is taken as an example of the substrate processing apparatus including a substrate holding device in the above preferred embodiment. However, examples of the substrate processing apparatus may include a coater for applying a processing solution such as resist to the surface of a substrate, a developer for developing a substrate, a heat treatment apparatus for adjusting the temperature of a substrate, and a transport apparatus for merely transporting a substrate.

Figure 6:
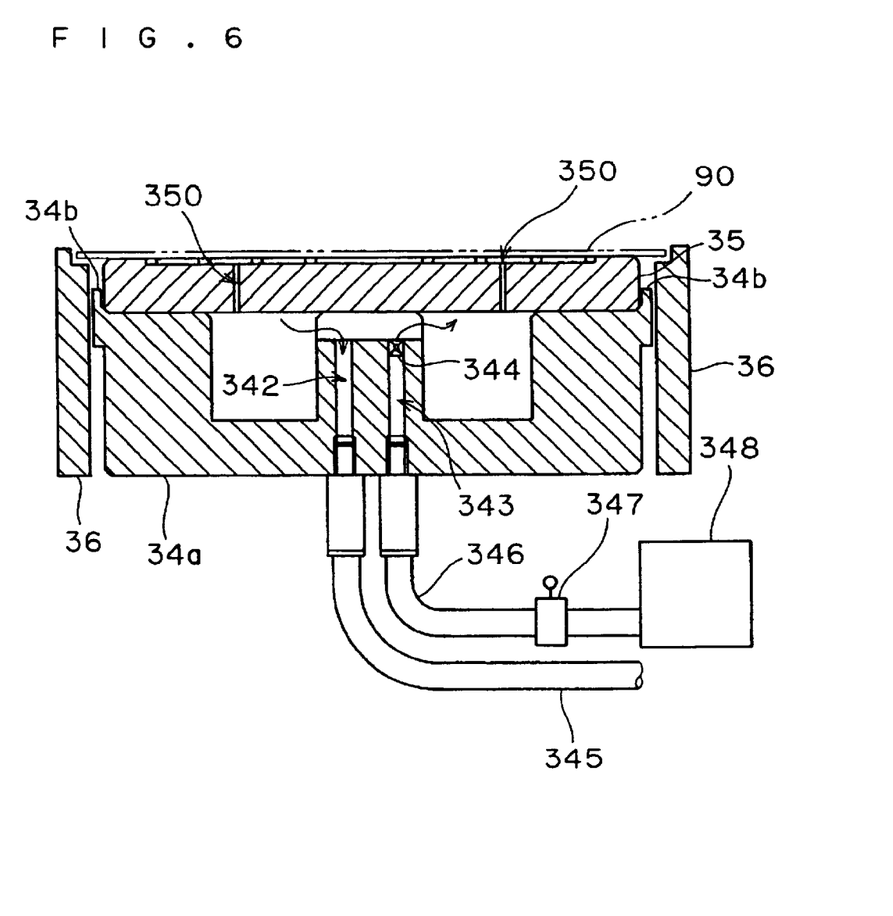
FIG. 6 is a sectional view showing a modification of the principal construction of the substrate holding part.

Although the fixing pin 341 of the fixing table 34 is used to position the holding member 35 in place in the inspection apparatus 1, the positioning member is not limited to such a structure. FIG. 6 is a sectional view showing the principal construction of the substrate holding part 33 structured based on such a principle. The substrate holding part 33 shown in FIG. 6 includes a fixing table 34a having a protrusion 34b extending along the outer periphery of a surface for contact with the holding member 35. The protrusion 34b defines the outer peripheral position of the holding member 35 when the holding member 35 is removably placed on the fixing table 34a. This facilitates the positioning of the holding member 35, for example, when the holding member 35 is removed for maintenance and is then attached to the fixing table 34a again.

The direction in which the substrate holding device attracts the substrate by vacuum suction is not limited to a substantially vertically downward direction as illustrated with the substrate holding part 33. For instance, the holding member may use the lower surface thereof as the holding surface to attract the substrate in a substantially vertically upward direction, or may use a side surface thereof as the holding surface for holding the substrate upright to attract the substrate in a substantially horizontal direction.

While the invention has been described in detail, the foregoing description is in all aspects illustrative and not restrictive. It is understood that numerous other modifications and variations can be devised without departing from the scope of the invention.

What is claimed is:

1. A substrate holding device for holding a substrate, comprising:

a holding member having an atmosphere flow passage for holding said substrate;

a suction pipe for sucking an atmosphere through said atmosphere flow passage; and a supply pipe for supplying a predetermined gas to said atmosphere flow passage, wherein said predetermined gas is supplied through said supply pipe while said atmosphere is sucked through said suction pipe, thereby to release said substrate from said holding member.

2. The substrate holding device according to claim 1, wherein the supply rate of said predetermined gas supplied through said supply pipe for releasing said substrate is not less than the suction rate of said atmosphere sucked through said suction pipe.

3. The substrate holding device according to claim 1, further comprising a fixing table for fixing said holding member, wherein said holding member is removably placed on said fixing table.

4. The substrate holding device according to claim 3, wherein said fixing table includes a table body, and a positioning member coupled to said table body to define a relative position of said holding member and said fixing table.

5. The substrate holding device according to claim 1, wherein said predetermined gas is an inert gas.

6. The substrate holding device according to claim 1, wherein said supply pipe includes an adjustment mechanism for adjusting the supply rate of said predetermined gas.

7. The substrate holding device according to claim 1, further comprising a guide member for guiding said substrate.

8. A substrate processing apparatus for performing a predetermined process on a substrate, comprising:

a) a substrate holding device including a-1) a holding member having an atmosphere flow passage for holding said substrate, a-2) a suction pipe for sucking an atmosphere through said atmosphere flow passage, and a-3) a supply pipe for supplying a predetermined gas to said atmosphere flow passage, said predetermined gas being supplied through said supply pipe while said atmosphere is sucked through said suction pipe, thereby to release said substrate from said holding member; and b) a processing unit for performing said predetermined process on said substrate held by said substrate holding device.

9. A method of releasing a substrate in a substrate holding device for holding a substrate under suction using a holding member, said method comprising the steps of:

(a) sucking an atmosphere through a suction pipe from an atmosphere flow passage provided to said holding member;

(b) holding a substrate using said holding member;

(c) supplying a predetermined gas through a supply pipe toward said atmosphere flow passage; and (d) in a state in which said step (a) continues, releasing said substrate held in said step (b), said step (d) being triggered by said step (c).

10. The method according to claim 9, wherein in said step (d), the supply rate of said predetermined gas supplied through said supply pipe for releasing said substrate is not less than the suction rate of said atmosphere sucked through said suction pipe.

11. The method according to claim 9, wherein in said step (c), said predetermined gas is an inert gas.

12. The method according to claim 9, wherein said step (c) comprises the step of:

(c-1) adjusting the supply rate of said predetermined gas.

13. The method according to claim 9, further comprising the steps of:

(e) after said step (c), stopping said step (a); and (f) after said step (e), stopping said step (c).

* * * * *